United States Patent
Yoo et al.

(10) Patent No.: US 7,863,178 B2
(45) Date of Patent: Jan. 4, 2011

(54) METHOD FOR MANUFACTURING A GAN BASED OPTICAL DEVICE

(75) Inventors: Tae-Kyung Yoo, Yongin-si (KR); Joong Seo Park, Yongin-si (KR); Eun Hyun Park, Seongnam-si (KR)

(73) Assignees: Epivalley Co., Ltd., Koomi (KR); Samsung LED Co., Ltd., Gyunggi-do (KR)

( * ) Notice: Subject to any disclaimer, the term of this patent is extended or adjusted under 35 U.S.C. 154(b) by 1400 days.

(21) Appl. No.: 10/542,485

(22) PCT Filed: Aug. 21, 2004

(86) PCT No.: PCT/KR2004/002113
§ 371 (c)(1), (2), (4) Date: Jul. 15, 2005

(87) PCT Pub. No.: WO2005/022655
PCT Pub. Date: Mar. 10, 2005

(65) Prior Publication Data
US 2006/0138446 A1    Jun. 29, 2006

(30) Foreign Application Priority Data
Sep. 3, 2003    (KR) .................... 10-2003-0061551
Mar. 30, 2004    (KR) .................... 10-2004-0021399

(51) Int. Cl.
*H01L 21/3205* (2006.01)
(52) U.S. Cl. .................... 438/602; 438/603; 438/604; 438/48; 438/E21.112
(58) Field of Classification Search .................. 438/47, 438/22, 48–52, 602–604
See application file for complete search history.

(56) References Cited

U.S. PATENT DOCUMENTS

| 5,247,533 A | 9/1993 | Okazaki et al. |
| 5,306,662 A | 4/1994 | Nakamura et al. |
| 6,043,140 A | 3/2000 | Kawai et al. |
| 6,413,312 B1 | 7/2002 | Kawai et al. |
| 6,508,879 B1 * | 1/2003 | Hashimoto ................... 117/104 |
| 2006/0157714 A1 * | 7/2006 | Yoo et al. ..................... 257/79 |

FOREIGN PATENT DOCUMENTS

| JP | 08056015 | * 12/1994 |
| JP | 8-255930 A | 10/1996 |
| JP | 8-316151 A | 11/1996 |
| JP | 9-251957 A | 9/1997 |
| JP | 2003-178987 A | 6/2003 |
| KR | 10-2001-0046264 | 6/2001 |

OTHER PUBLICATIONS

English abstract and machine translation of JP 08-056015.*

* cited by examiner

*Primary Examiner* — Dung A. Le
(74) *Attorney, Agent, or Firm* — Husch Blackwell LLP

(57) ABSTRACT

The present invention relates to an AlGaInN based optical device fabricated by a new p-type AlGaInN:Mg growth method and method for manufacturing the same, including a p-type nitride semiconductor layer that is grown using both $NH_3$ and a hydrazine based source as a nitrogen precursor, thereby an additional subsequent annealing process for extracting hydrogen is not necessary and thus the process is simple and an active layer can be prevented from being thermally damaged by subsequent annealing.

6 Claims, 11 Drawing Sheets

P-GaN Growth

After P-GaN Growth
- P-type

Hydrazine +NH$_3$ + TMGa + Cp$_2$Mg

P-GaN Growth

After P-GaN Growth – P-type

P-GaN according to the present invention; without annealing

FIG. 10 existing P-GaN; without annealing annealing for 10 minutes annealing for 30 minutes

METHOD FOR MANUFACTURING A GAN BASED OPTICAL DEVICE

TECHNICAL FIELD

The present invention relates to an AlGaInN based optical device fabricated by a new p-type AlGaInN:Mg growth method and method for manufacturing the same. More particularly, the present invention relates to an AlGaInN based optical device using a hydrazine based source having a hydrogen absorption function in which p-type AlGaInN:Mg is grown by a metal organic chemical vapor deposition (hereinafter, referred to as "MOCVD") method using a mixture of the hydrazine based source having the hydrogen absorption function upon thermal decomposition and an ammonia nitrogen precursor, and method for manufacturing the same.

In the above, the AlGaInN based optical device refers to an optical device including a compound semiconductor layer composed of $Al_xGa_yIn_{1-x-y}N$ ($0 \leq x \leq 1$, $0 \leq y \leq 1$, $x+y \leq 1$), but may include a compound semiconductor layer composed of other III-V group elements or a semiconductor layer composed of materials other than the III-V group elements. Also, this semiconductor layer may include heterogeneous materials.

The optical device of the present invention is preferably a light emitting device as a p-n diode, more preferably a light emitting diode. In this context, description will be made mainly on a nitride semiconductor light emitting device. However, it will be evident to those skilled in the art that the present invention can be applied to any other optical devices including a p-type nitride semiconductor layer.

BACKGROUND ART

In a nitride semiconductor light emitting device, hydrogen is undesirably included in a p-type nitride semiconductor layer upon fabrication of the p-type nitride semiconductor layer. At this time, the p-type nitride semiconductor layer has the property of an insulator, but not the property of a semiconductor due to hydrogen. It is thus required that an additional activation annealing process for eliminating hydrogen be performed after the p-type nitride semiconductor layer has been formed.

Figure 3:
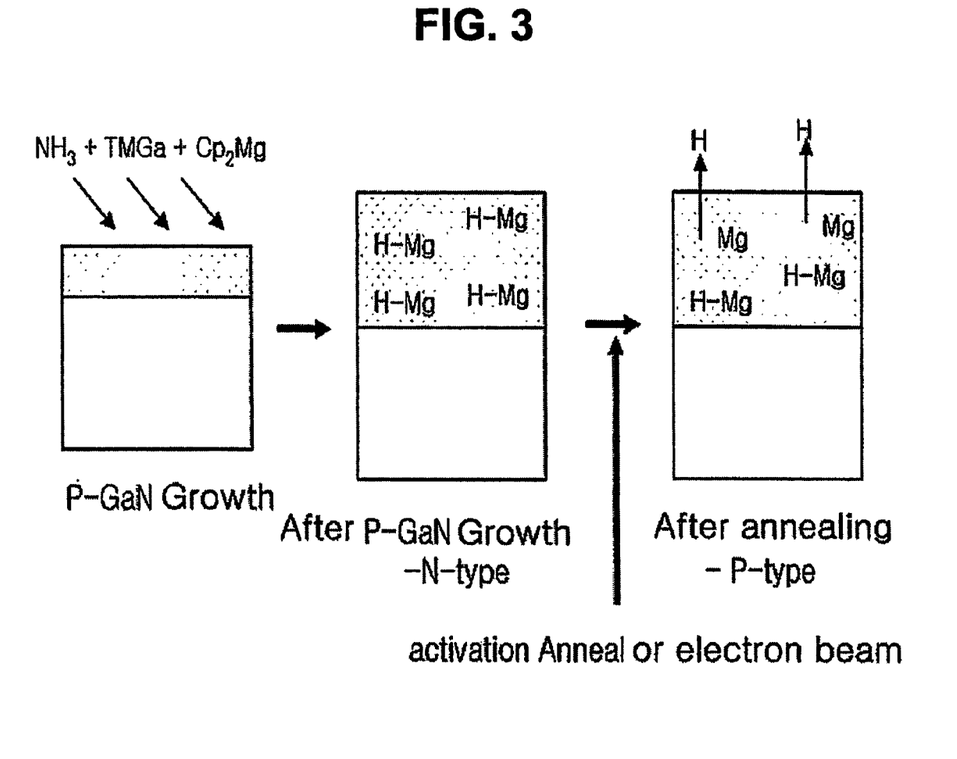
FIG. 3 is a view showing a method for growing p-GaN and a method for obtaining a p-type in a prior art.
Figure 4:
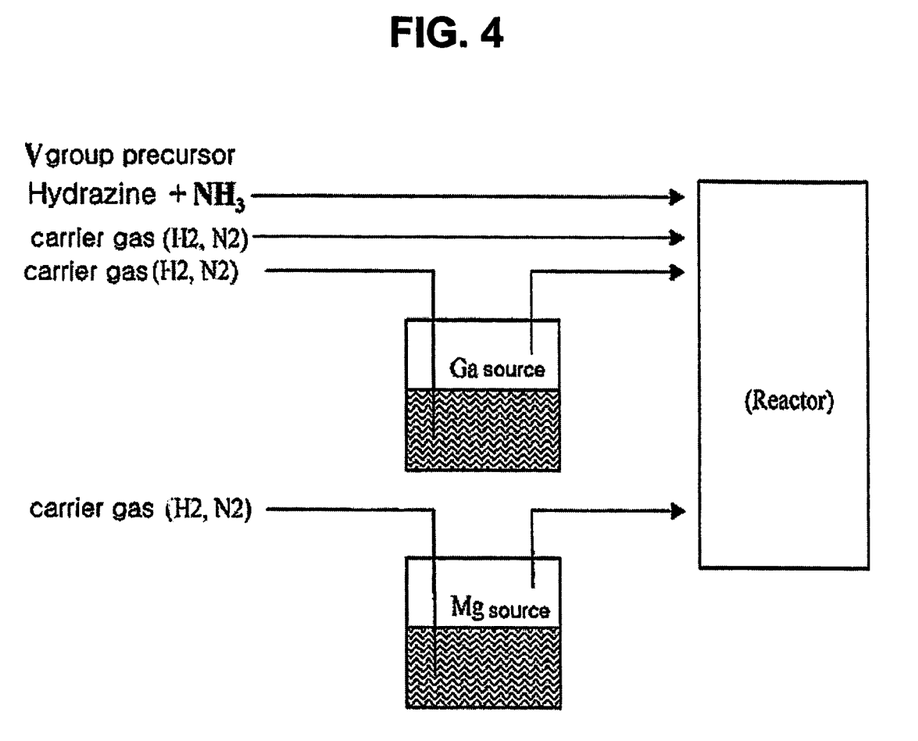
FIG. 4 is a view showing a source injection mode in a MOCVD method for fabricating a LED according to the present invention.

As shown in FIG. 3, U.S. Pat. No. 5,306,662 discloses a method for eliminating hydrogen through annealing at a temperature of over 400° C. after a p-type nitride semiconductor layer has been grown. U.S. Pat. No. 5,247,533 presents a method for forming a p-type nitride semiconductor layer through electron beam illumination.

In case of electron beam illumination, however, it is difficult to form a uniform p-type nitride semiconductor layer. In case of annealing, an underlying active layer may be thermally damaged due to the annealing process. Therefore, there is a high possibility that the performance of devices can be degraded.

Meanwhile, U.S. Pat. No. 6,043,140 proposes a method for fundamentally prohibiting introduction of hydrogen upon growth of p-type GaN by using a nitrogen precursor and a nitrogen carrier from which hydrogen is not generated. It is, however, difficult to obtain satisfactory surface morphology through this method. This method can be considered a reasonable approach in terms of the principle. In an actual application, however, specially, in terms of mass production of a commercial light emitting device, this method is considered an unpractical technology. Moreover, the cost of a hydrazine based source is greatly expensive as compared with ammonia. In this connection, it is considered that the competitiveness in the cost of the commercial light emitting device may be lost.

Figure 1:
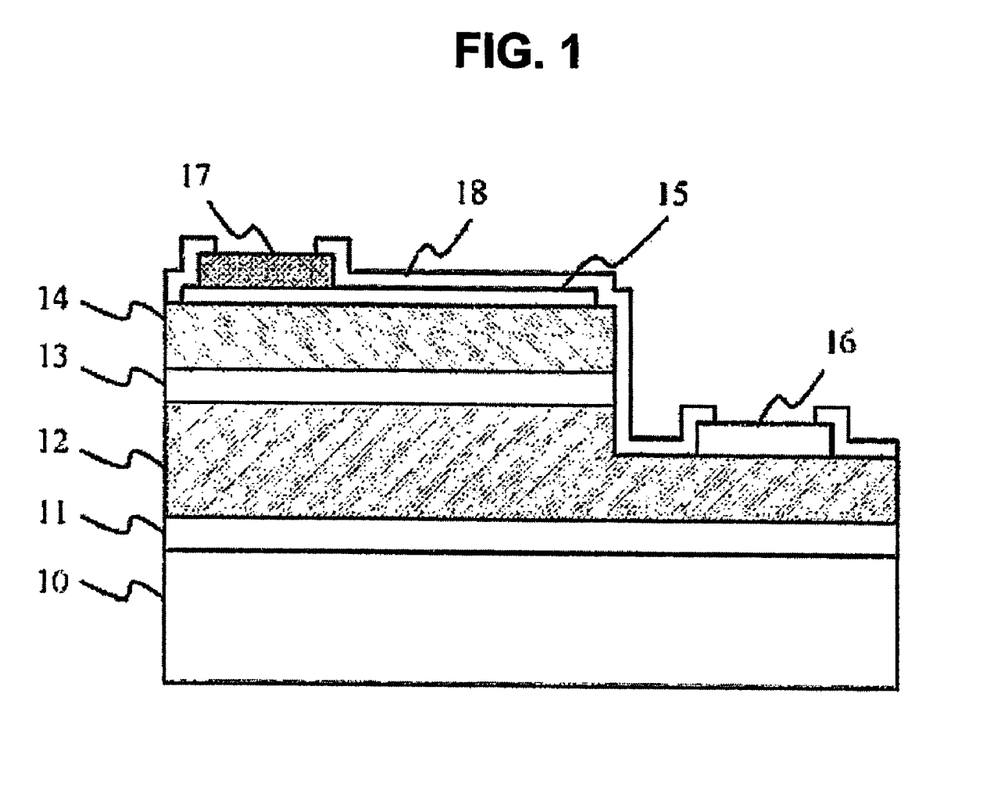
FIG. 1 is a cross-sectional view illustrating the structure of a conventional AlGaInN based LED.

FIG. 1 is a cross-sectional view illustrating the structure of a conventional AlGaInN based LED.

A method for the conventional AlGaInN based LED will be below described in short. A nitride semiconductor light emitting device includes a buffer layer 11, a semiconductor layer 12 composed of a n-type nitride semiconductor, an active layer 13 composed of a nitride semiconductor that emits light through recombination of electrons and holes, and a semiconductor layer 14 composed of a p-type nitride semiconductor, all of which are sequentially grown on a substrate 10.

Thereafter, an activation annealing process is performed wherein hydrogen contained in the nitride semiconductor layer 14 is stripped at a high temperature of 400° C. or more. An electrode layer 15 is then formed on the nitride semiconductor layer 14 that is electrically brought into contact with the electrode layer 15. The nitride semiconductor layer 14 and the active layer 13 are mesa-etched to expose the nitride semiconductor layer 12. An n-type electrode layer 16 is formed on the nitride semiconductor layer 12 and a bonding pad 17 is then formed on the electrode layer 15. Finally, a protect film 18 is formed.

The bonding pad 17 is usually formed on the electrode layer 15, but may be directly formed on the nitride semiconductor layer 14 after some of the electrode layer 15 has been removed. An n-type nitride semiconductor layer of a high concentration or a superlattice layer made of an nitride semiconductor can be inserted between the nitride semiconductor layer 14 and the electrode layer 15 in order to form a tunnel junction therebetween. The substrate 10 is formed using sapphire, SiC, GaN, AlN or the like, but may be formed using any kind of a material on which a nitride semiconductor layer can be grown.

Figure 2:
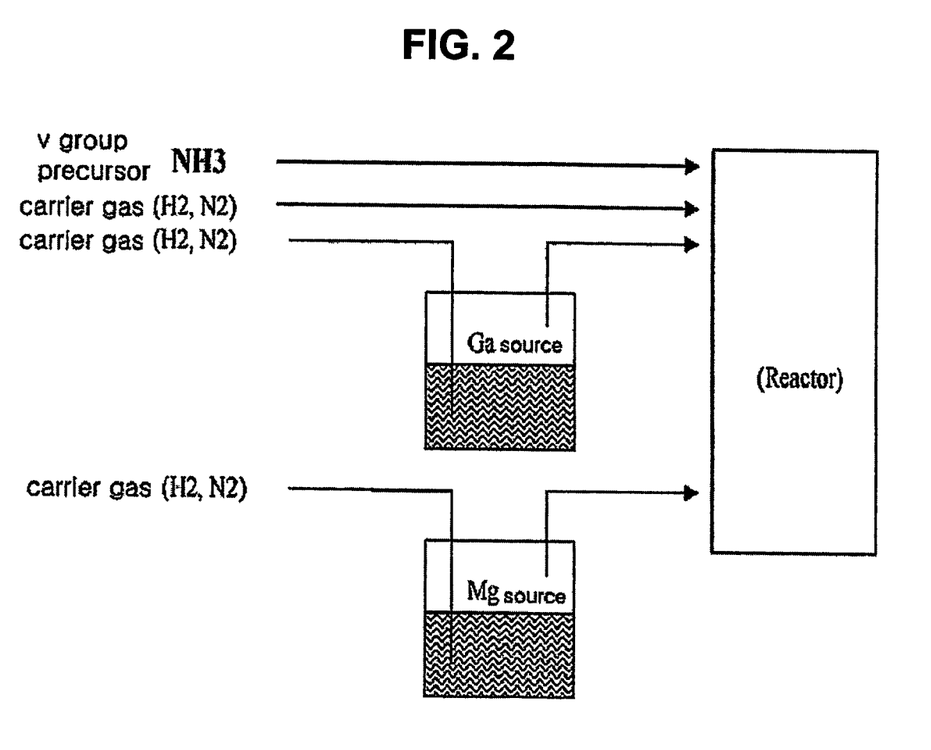
FIG. 2 is a view showing a source injection mode in a MOCVD (Metal Organic Chemical Vapor Deposition) method for manufacturing a conventional LED.

In order to fabricate such a light emitting device, single crystal growth is required. A MOCVD (Metal Organic Chemical Vapor Deposition) method is usually used. In this case, as shown in FIG. 2, ammonia ($NH_3$) is used as a supply source of nitrogen (N) for growing GaN. In growing GaN, $H_2$ is usually used as a carrier gas. In order to grow InGaN, $N_2$ is usually used as a carrier gas.

Ammonia ($NH_3$) is very thermally stabilized. Thus, only several % of $NH_3$ is thermally decomposed at a temperature of over 1000° C. and this decomposed ammonia ($NH_3$) contributes to growth of GaN as a nitrogen (N) supply source. Accordingly, in order to increase efficiency of thermal decomposition, high temperature growth is inevitably needed. Ammonia ($NH_3$) also has a very high $NH_3$/Ga ratio, which is required in order to obtain GaN having a good crystallization property.

A large amount of $NH_3$ generates a large amount of hydrogen as a byproduct. In this case, when p-type GaN is grown, hydrogen is combined with magnesium as a p-type dopant, resulting in a magnesium (Mg)-hydrogen (H) atomic bonding. Thus, magnesium (Mg) does not produce holes and the p-type GaN does not have the property of a semiconductor.

Therefore, after the p-type GaN has been grown, it experiences a subsequent annealing process for breaking the magnesium(Mg)-hydrogen (H) atomic bonding at a temperature of 400° C. or more. For this reason, Mg provides holes and the p-type GaN has the property of a semiconductor.

As described above, the conventional nitride semiconductor light emitting device requires electron beam illumination or a process for annealing at a high temperature of over 400° C. in order to obtain p-type GaN of a high quality. However, this makes the process complicated and the active layer 13 is thermally damaged during the annealing process. Resultantly, there is a high possibility that the performance of a device may be degraded.

Disclosure

Technical Problem

Accordingly, the present invention has been made in view of the above problems, and it is an object of the present invention to provide an AlGaInN based optical device in which an additional subsequent annealing process for eliminating hydrogen is not needed by preventing hydrogen from being contained in an nitride semiconductor layer when a p-type nitride semiconductor layer is grown, and method for manufacturing the same.

Technical Solution

To achieve the above object, according to one aspect of the present invention, there is provided an AlGaInN based optical device including a p-type nitride semiconductor layer that is grown using $NH_3$ as a nitrogen precursor, wherein the p-type nitride semiconductor layer is grown using both $NH_3$ and a hydrazine based source as the nitrogen precursor.

Furthermore, the AlGaInN based optical device according to the present invention may further include an active layer that emits light through recombination of electrons and holes, wherein the p-type nitride semiconductor layer supplies holes to the active layer.

In addition, in the AlGaInN based optical device according to the present invention, radicals generated when the hydrazine based source is thermally decomposed may include at least one of $CH_3$ and $NH_2$.

Furthermore, according to another aspect of the present invention, there is also provided a method for manufacturing an AlGaInN based optical device, including the step of growing a p-type nitride semiconductor layer using $NH_3$ as an nitrogen precursor, wherein the step includes growing the p-type nitride semiconductor layer using both $NH_3$ and a hydrazine based source as the nitrogen precursor.

In addition, in the method for manufacturing the AlGaInN based optical device according to the present invention, a carrier gas of the nitrogen precursor may be at least one of nitrogen and hydrogen.

Also, in the method for manufacturing the AlGaInN based optical device according to the present invention, the hydrazine based source may be at least one of monomethylhydrazine, dimethylhydrazine and tertiarybutylhydrazine.

Advantageous Effects

According to the present invention, an additional subsequent annealing process for extracting hydrogen is not necessary. Therefore, a process is simple and an active layer can be prevented from being thermally damaged by subsequent annealing.

Furthermore, according to the present invention, it is possible to obtain a nitride semiconductor layer of a p-type without a subsequent annealing process and to form a p-type nitride semiconductor layer having morphology of the degree required by a light emitting device.

DESCRIPTION OF DRAWINGS

Further objects and advantages of the invention can be more filly understood from the following detailed description taken in conjunction with the accompanying drawings in which.

MODE FOR INVENTION

The present invention will now be described in detail in connection with preferred embodiments with reference to the accompanying drawings. In the drawings, the same reference numerals as FIG. 1 indicate components that perform the same function. Description on those components will be omitted in order to avoid redundancy of explanation.

Figure 5:
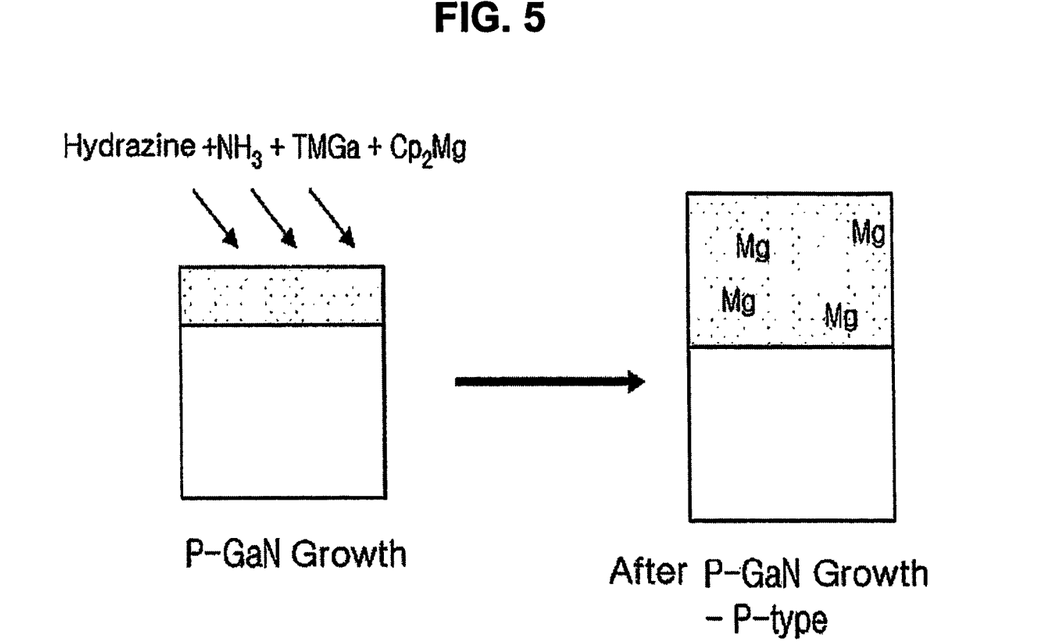
FIG. 5 is a view showing a method for growing p-GaN and a method for obtaining a p-type layer according to the present invention.

As shown in FIG. 5, a hydrazine based source having a hydrogen absorption function upon thermal decomposition is mixed with an ammonia nitrogen precursor, so as to prohibit formation of an Mg—H complex due to hydrogen radicals within an AlGaInN:Mg thin film. Thus, a p-type semiconductor layer is obtained without growing a thin film and performing a subsequent annealing process. Therefore, it is possible to minimize the amount of H radicals in the grown AlGaInN:Mg thin film.

Hereinafter, the principle that p-type AlGaInN:Mg is obtained without a subsequent annealing process by using a mixture of the hydrazine based source having the hydrogen absorption function and the ammonia nitrogen precursor will be described.

Dimethylhydrazine (DM-hydrazine) will be described as an example of a hydrazine based source having the hydrogen absorption function. Bond energy between a nitrogen radical and a nitrogen radical of this material is 33.4 Kcal, which is significantly lower than 93.3 Kcal, which is bond energy between a nitrogen radical and a hydrogen radical of ammonia.

Therefore, as in chemical equation 1, the bond between nitrogens of the hydrazine material is easily broken at a low temperature of over 500° C. Thus, a NH2 radical is formed.

Equation 1

At this time, the $NH_2$ radical formed is a material that is very unstable and has a high reactivity. Thus, the $NH_2$ radical will try to become thermally stable ammonia ($NH_3$) through bonding with a neighboring H radical as soon as possible. The $(CH_3)_2N$ radical that is firstly formed through thermal decomposition of hydrazine material produces an N radical and $CH_3$ radicals through second thermal decomposition.

Meanwhile, $CH_3$ radical is also thermally unstably and thus tries to form $CH_4$ through bonding with neighboring hydrogen.

Therefore, if hydrazine material is used as a nitrogen precursor for growing AlGaInN:Mg as above, there is an effect in that the amount of hydrogen radicals existing in the gas phase layer is reduced as in chemical equation 2. Therefore, it is possible to minimize formation of a Mg—H complex, which is easily generated when ammonia only is used.

EQUATION 2

As a result, as indicated in chemical equation 2, radicals ($NH_2$, $CH_3$) for reducing the concentration of hydrogen are generated from hydrazine material, so that the amount of hydrogen existing in a reactor is reduced. Thus, formation of Mg—H complex during the growth of the thin film, is minimized. Therefore, p-GaN crystal itself can be formed as a p-type layer.

A p-Al(x)Ga(y)In(z)N:Mg layer is then formed under the condition in which the x, y and z ratio in Al(x)Ga(y)In(z)N is (x+y+z=1, $0 \leq x \leq 1$, $0 \leq y \leq 1$, $0 \leq z \leq 1$).

Also, thin films of optical devices such as an Al(x)Ga(y)In(z)N based light emitting diode (LED), laser diode (LD) or photo diode (PD) are formed as a p-type Al(x)Ga(y)In(z)N:Mg thin film according to the present invention.

In addition, a thin film of an Al(x)Ga(y)In(z)N based electronic device is formed to be a p-type Al(x)Ga(y)In(z)N:Mg thin film according to the present invention.

The above theoretical principle was clearly proven through several experiments in a concrete way. The experimental results will be described below.

In this experiment, dimethylhydrazine (DMEy) is used as a hydrazine based source, trimethylgallium (TMGa) is used as a gallium (Ga) source and $Cp_2Mg$ is used as a magnesium (Mg) source.

Furthermore, ammonia is used as a main nitrogen precursor. The hydrazine based source is mixed with ammonia in order to remove hydrogen radicals. If hydrazine based source is used, it serves to not only lower the concentration of the hydrogen radicals due to $NH_2$ and $CH_3$ radicals but also generate nitrogen radicals. Accordingly, if hydrazine based source is used, there is an advantage in that a small amount of ammonia can be used as compared with the prior art.

Moreover, it is preferred that the amount of hydrazine based source used to grow the p-type AlGaInN:Mg thin film is in a range of 1 to 500 in the molar flow ratio of hydrazine based source and gallium (V(hydrazine based source)/III(gallium)), more preferably is in a range of 1 to 300.

If the hydrazine based source with the molar flow ratio of below 1 is used, the amount of hydrazine based source is relatively smaller than the amount of ammonia. Thus, the concentration of hydrogen is not sufficiently reduced as compared with formation of hydrogen through decomposition of ammonia. Also, if the hydrazine based source with the molar flow ratio of 500 or more, the amount of C—N radicals generated from hydrazine based source as a byproduct is increased. In this case, the property of the thin film can be degraded. According to the present experiment, although hydrazine based source with the molar flow ratio of 10 is used, the concentration of hydrazine based source can be sufficiently lowered. Thus, it is not easy to acquire a better result by using the hydrazine based source with the molar flow ratio of over 300, even though taken into consideration that the amount of ammonia can be changed depending on the actual situations. Accordingly, it is preferred that the hydrazine based source with the molar flow ratio of 300 or below is used considering the material cost and so on.

At this time, the amount of ammonia is in a range of 100 to 10000 in the molar flow ratio of V(ammonia)/III(Ga), more preferably is in a range of 100 to 8000.

If the ammonia with the molar flow ratio of below 100 is used, although the nitrogen precursor is formed in hydrazine based source, the actual amount of nitrogen precursor is small. Thus, the quality of the thin film is extremely degraded due to the shortage of the total amount of nitrogen precursor. For this reason, it is preferred that the ammonia with the molar flow ratio of 100 of more is used considering thermal decomposition of ammonia and so on. If the ammonia with the molar flow ratio of more 10000 is used, the amount of hydrogen generated by ammonia is increased. Thus, the possibility that magnesium is combined with hydrogen can be relatively higher. In this connection, it is preferred that the ammonia with the molar flow ratio of 8000 or below, which is an existing ammonia condition, is used. However, the ammonia with the molar flow ratio of more 10000 can be used. In this case, even though hydrogen bonding is increased, there is a tendency that the electrical property of a device is improved as compared with the existing post-annealing process. Therefore, according to the present invention, if the electrical property that has a little good quality as compared with the prior art is allowed, the ammonia with the molar flow ratio of more 10000 can be used.

Figure 6:
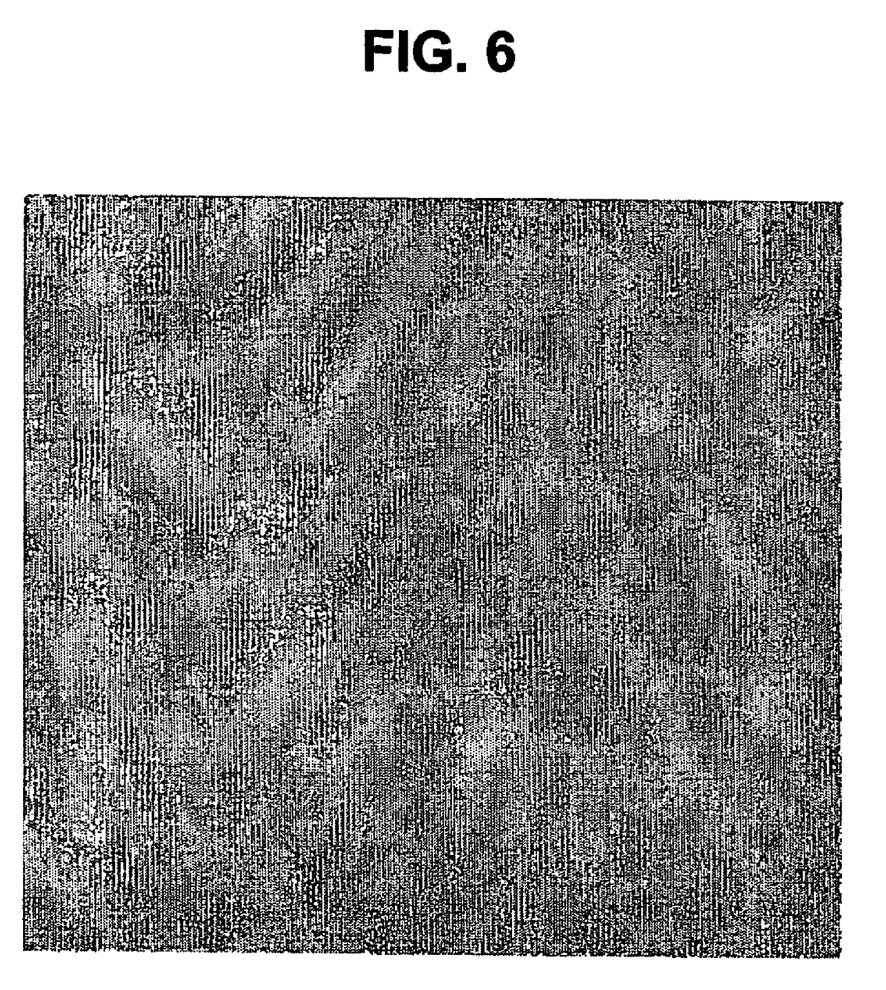
FIG. 6 is a photograph showing the surface of p-GaN according to the present invention.

FIG. 6 shows a photograph of the surface of a sample, which shows the surface of p-type GaN that is grown when a mixture of ammonia and hydrazine (V/III=10) is used. From FIG. 6, it can be seen that the morphology of the sample is very good.

Figure 7:
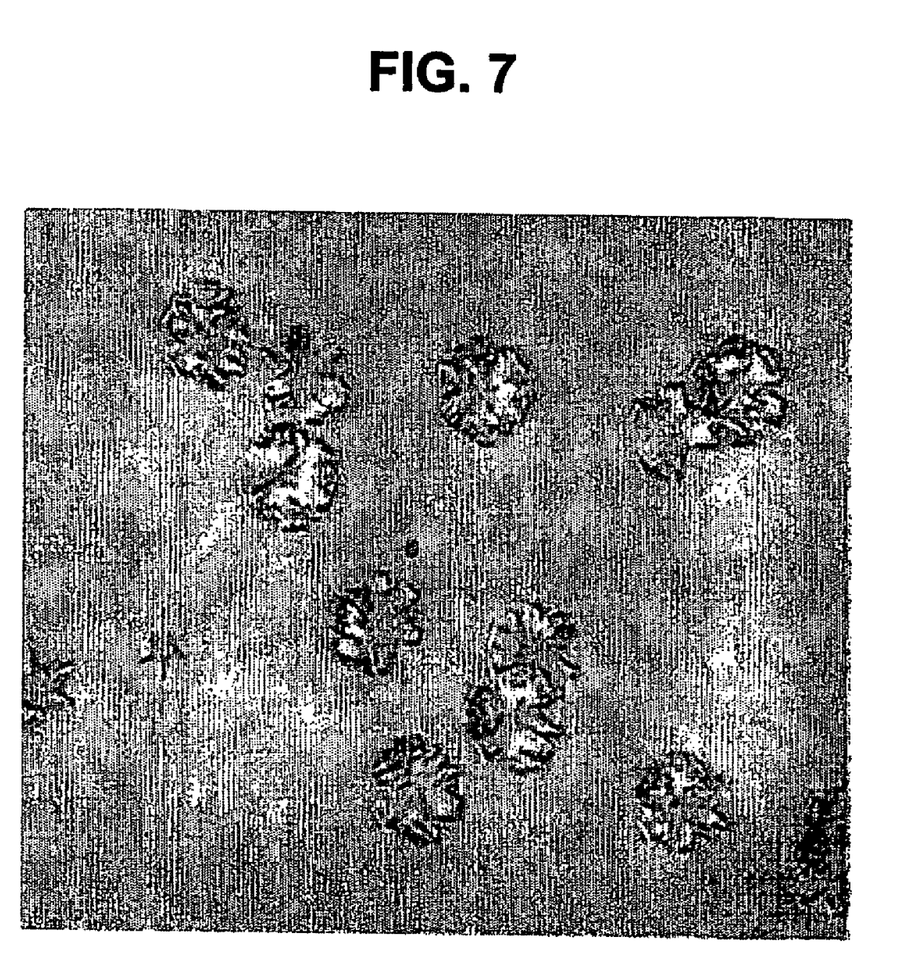
FIG. 7 is a photograph showing the surface of p-GaN using only hydrazine as a nitrogen precursor.

In addition, a photograph of the surface according to a comparative experiment is shown in FIG. 7. FIG. 7 shows a case where only hydrazine based source with the same molar flow ratio as the above sample is used as a nitrogen precursor. From the drawing, it can be seen that a thin film is not completely formed when the amount of hydrazine based source corresponding to the amount used in the above experiment is used. In addition, the thin film is not regularly grown and irregularly formed with some islands. Therefore, as described above, the main object of using the hydrazine based source in the present invention is to form radicals for lowering the concentration of hydrogen. Of course, nitrogen generated as a result of thermal decomposition of hydrazine based source can act as a nitrogen precursor in growing a GaN thin film.

When the p-type AlGaInN:Mg thin film is grown by the method proposed in the present invention, hydrogen ($H_2$) as well as nitrogen ($N_2$) can be used as a carrier gas, and preferably nitrogen is mainly used in order to prohibit formation of hydrogen radicals. However, if a mixture of nitrogen and hydrogen is used, a higher hole concentration can be obtained.

This is because hydrogen serves to reduce the background doping concentration when GaN is grown. Therefore, according to the present invention, when the p-type AlGaInN:Mg thin film is grown, nitrogen, hydrogen or a mixture gas of nitrogen and hydrogen can be used as carrier gas.

The reason the background doping concentration can be reduced by mixing the hydrogen carrier is assumed that the C—N radical generated from hydrazine is removed by the hydrogen carrier, thereby lowering absorption of the C—N radical within p-GaN and thus reducing the ground concentration.

A p-type GaN thin film was grown according to the method proposed by the present invention, the hall measurement and the PL measurement were implemented, and the results of the measurements were then compared with a p-type GaN layer using only existing ammonia.

Figure 8:
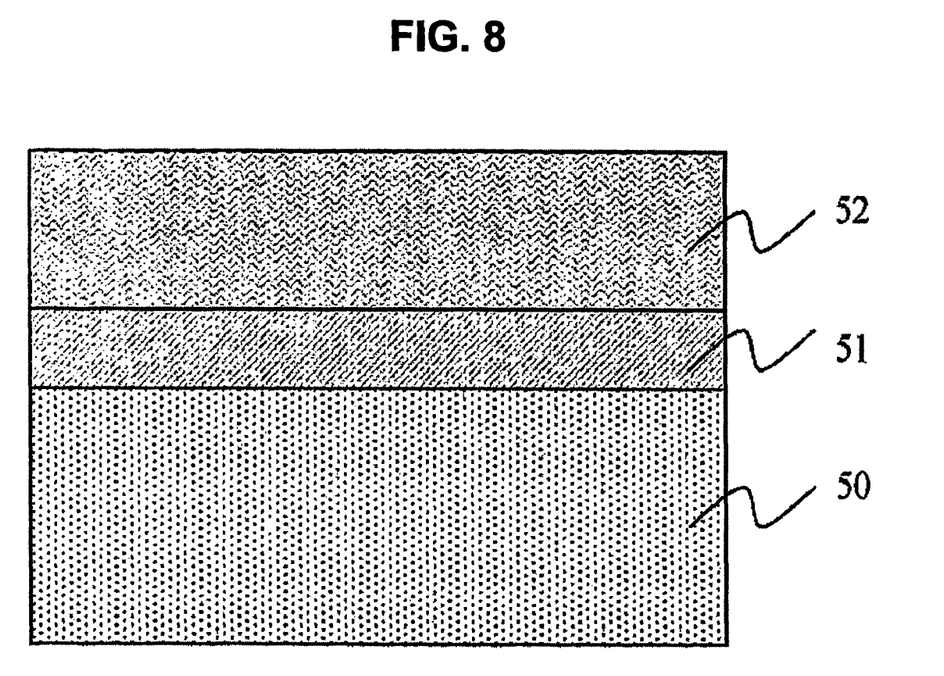
FIG. 8 is a cross-sectional view illustrating a structure of a test sample for hall measurement.

As shown in FIG. 8, a buffer layer 51 is formed on a sapphire substrate 50. A GaN layer 52 having a predetermined thickness, which is not doped, is formed on the buffer layer 51. A p-type GaN layer is then grown using ammonia, hydrazine based source, TMGa and $Cp_2Mg$. As a comparative sample, a p-GaN layer having the same structure as that of FIG. 8 is grown using ammonia, TMGa and $Cp_2Mg$.

Furthermore, the p-GaN layer using ammonia has the property of an insulator due to Mg-H combination. It is thus difficult to implement the hall measurement. Therefore, after the concentration of hydrogen radical had been lowered by performing annealing at high temperature according to the existing method, the p-GaN layer was converted to a p-type layer. In this state, hall measurement was implemented.

On the contrary, p-GaN using hydrazine based source having the hydrogen radical absorption function, which is proposed by the present invention, did not undergo any annealing after the thin film had been grown. In this state, hall measurement was implemented and the result showed that the thin film grown in accordance with the present invention not using a subsequent annealing process has a p-type conductivity.

In addition, the measurements were implemented in which contact metal-alloy was not applied to the p-type contact metal used in the hall measurements, so as to eliminate a possible dispute over conversion into p-type layer due to alloy annealing.

By employing the method proposed by the present invention, the hole concentration of $2-13\times10^{17}$ [/cm$^3$] and the hole mobility of 10-50 [cm$^2$/Vs] were obtained without a subsequent process such as annealing.

Also, sheet resistance, which is lowered 2 to 3 times than a sample in which ammonia is used and for which annealing is performed, was obtained.

These measurement results are an important ground of the present invention in showing that a p-type AlGaInN:Mg thin film is grown simultaneously when the thin film is grown if hydrazine based source proposed by the present invention is used.

Figure 9:
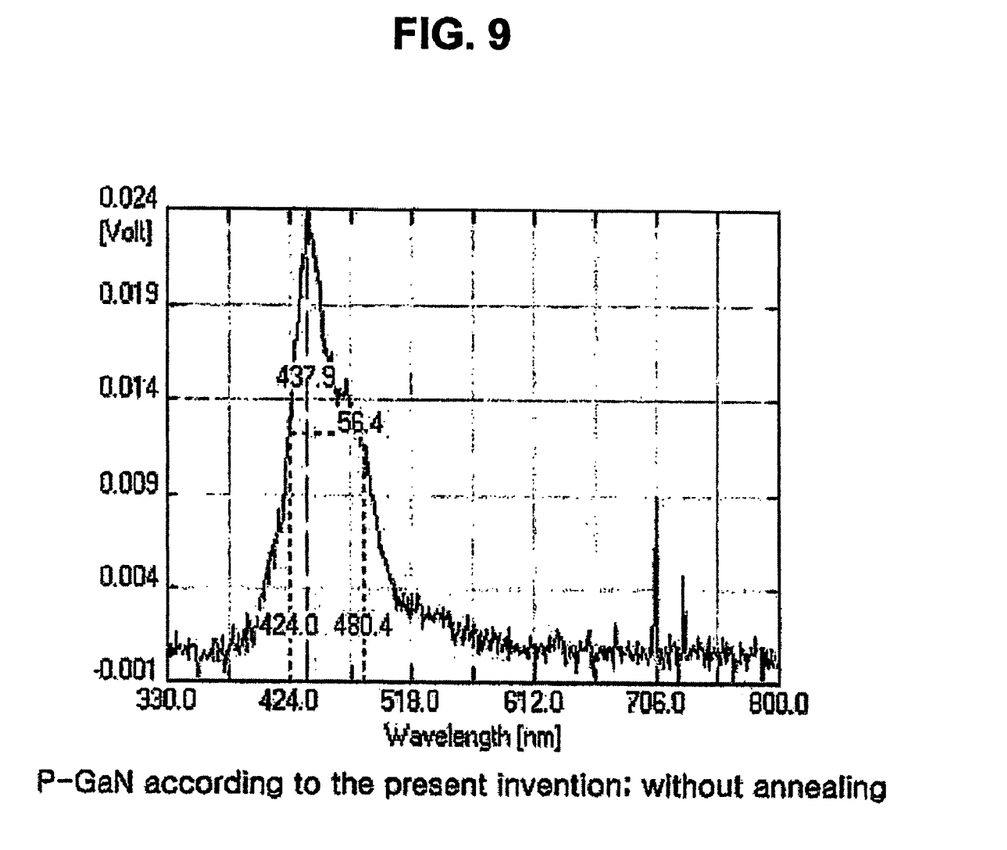
FIG. 9 is a graph showing the results of photoluminescence (PL) measurement of p-GaN according to the present invention.

FIG. 9 shows the result of photoluminescence (PL) measurement of sample grown according to the present invention.

500 nm or more is reduced. If the annealing progresses sufficiently, there is a tendency that the yellow band is almost removed. This phenomenon is a universal one.

Meanwhile, as shown in FIG. 9, in the p-GaN proposed by the present invention, the yellow band was not measured, and PL measurement result similar to the case where p-GaN using ammonia was sufficiently annealed, was obtained. This is a quite different characteristic from the PL characteristic of existing p-GaN.

That is, this shows that p-GaN in which a mixture of a hydrazine based source and ammonia is used will be quite different from the existing method using an NH$_3$ nitrogen precursor only.

A LED was fabricated using a p-GaN formation method proposed by the present invention and the characteristic of the LED was then analyzed.

It was demonstrated by using a generalized phenomenon in growing a LED using existing ammonia only that in the method proposed by the present invention, the p-type layer formed is quite differently from the existing p-GaN using only ammonia in that the p-type conductivity is acquired simultaneously when the thin film is grown.

As shown in Table 1, the conventional LED device illustrated in FIG. 1 was fabricated after high temperature activation annealing used generally has been performed and the LED device according to the present invention was fabricated without high temperature activation annealing.

Also, an indium dot test was implemented in which indium dots are attached on the surface of a LED sample taken out from a MOCVD reactor in order to make metal contacts and the characteristic of the LED is measured.

Its fundamental reason is to completely preclude an unwanted annealing effect that may happen upon fabrication of a LED device and to easily confirm formation of a p-n diode.

Furthermore, in order to prevent an activation annealing effect from occurring while a temperature of the MOCVD reactor is lowered after the LED has been grown in the reactor, the reactor was cooled from a growth temperature to 300° C under an (ammonia +nitrogen) or (ammonia+hydrogen) atmosphere.

It has been generally known that the annealing activation effect disappears if a temperature of the reactor is lowered using ammonia.

TABLE 1

| P-GaN condition | NH3 used (activation) | Hydrazine used (w/o activation) | Hydrazine used (w/o activation) | Hydrazine used (w/o activation) |
|---|---|---|---|---|
| Cooling condition | NH$_3$ + NH$_3$ | NH$_3$ + N$_2$ | NH$_3$ + H$_2$ | NH$_3$ + H$_2$ (NH$_3$ + H$_2$ annealing@ 850° C., 10 min) |
| VF1 @20 mA | 5.5 V | 5.2 V (As-Grown) | 5.3 V (As-Grown) | 5.2 V (As-Grown) |
| Pout @20 mA | 12 | 13.3 | 12.57 | 13.5 |

Figure 10:
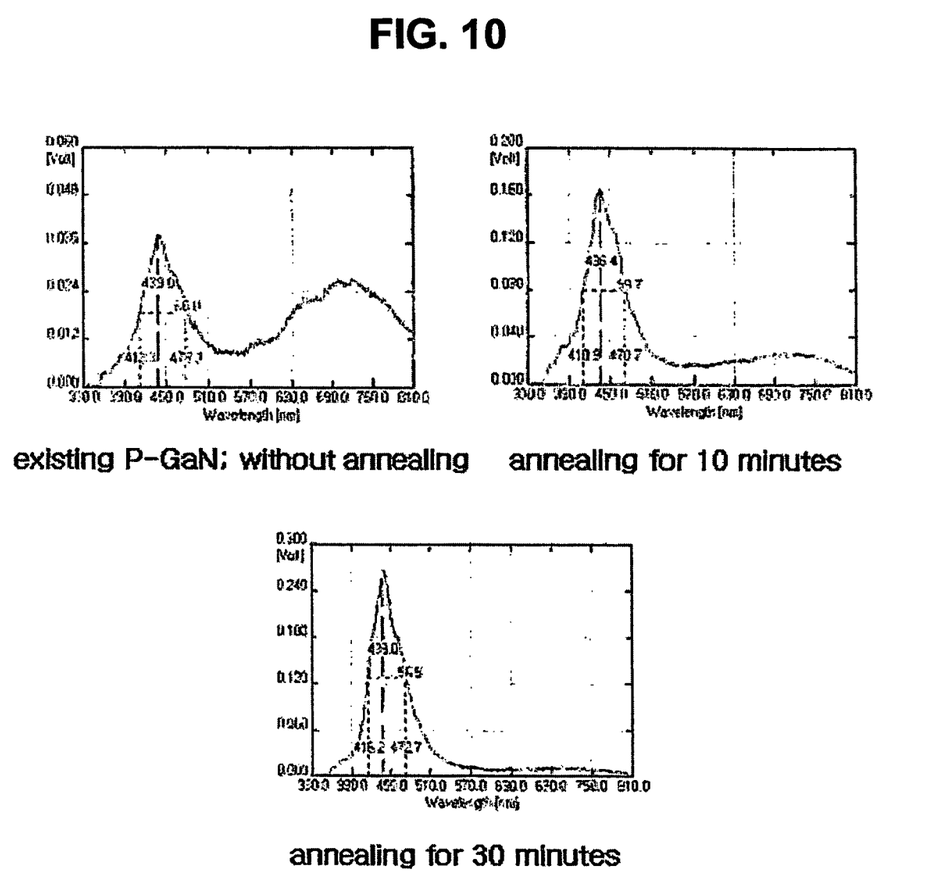
FIG. 10 is a graph showing the results of photoluminescence (PL) measurement of p-GaN using ammonia in a prior art.

FIG. 10 shows results of PL measurement of p-GaN grown using ammonia in which there is a tendency that a wide yellow band exists in 500 nm or more while the highest point of the PL spectrum exists between 430 and 450 nm in the PL characteristic of the p-GaN grown using ammonia.

If the p-GaN using only ammonia undergoes activation annealing at high temperature, the yellow band existing in As shown in Table 1, in case of the LED in which p-GaN is grown using hydrazine based source, both two cases where the reactor-is cooled up to 300° C. under the (ammonia+ nitrogen) or the (ammonia+hydrogen) atmosphere show that the LED is normally driven in the indium contact test.

The condition was used in which annealing activation cannot happen while the reactor is cooled, thus these results are important experimental ones that will support that the p-type layer is formed simultaneously when p-GaN is grown.

Furthermore, in order to demonstrate that the p-type layer is formed together with formation of p-GaN more certainly, a sample that is cooled under the (ammonia+hydrogen) atmosphere experiences annealing under an (ammonia (10 liter)+ hydrogen (10 liter)) atmosphere at a temperature of 850° C. for 10 minutes.

As known in the prior art, this is intended to test p-GaN formed according to the method proposed by the present invention for the purpose of disproving the experimental fact that if a sample from which a p-type layer is obtained through subsequent activation annealing is annealed again under an (ammonia+hydrogen) atmosphere of over 500° C., the sample returns to a characteristic like an insulator as Mg—H complex is formed.

As shown in Table 1, in the test result, the LED having the p-GaN structure employing the method proposed by the present invention almost keeps the electrical property or light emitting property in the indium contact test, unlike the already known fact.

This means that the p-type layer is almost kept intact. This experimental result is an important one that supports that the principle of p-type growth proposed by the present invention is fundamentally different from the existing growth principle.

Figure 11:
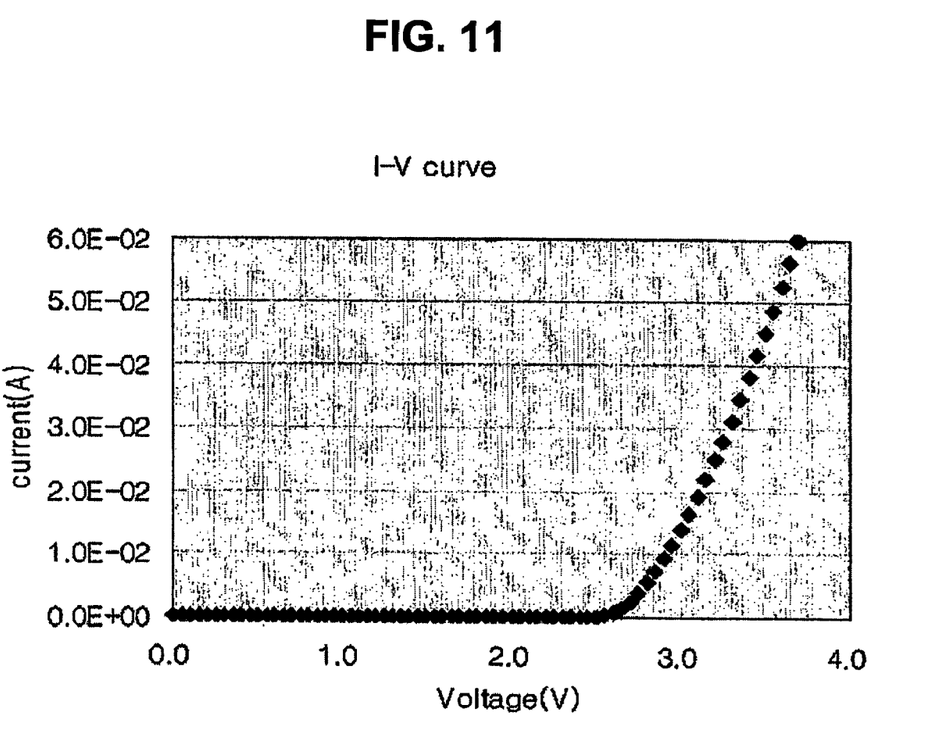
FIG. 11 shows a forward current-voltage curve of a LED according to the present invention.

FIG. 11 shows a forward current-voltage curve measured in a LED chip that is fabricated based on a normal LED process of a LED in which p-GaN is grown according to the present invention. Therefore, it was experimentally demonstrated that the LED grown according to the present invention could have characteristics that are by no means inferior to an existing LED, even without a subsequent annealing process.

Dimethylhydrazine, tertiarybutilhydrazine, monomethylhydrazine, etc. can be used as a hydrazine based source. It is more preferable that dimethylhydrazine capable of generating a $NH_2$ radical and a $CH_3$ radical at the same time upon thermal decomposition is employed according to the object of the present invention.

EXAMPLE 1

A buffer layer 11 and an n-$Al_xGa_yIn_{1-x-y}N$ layer 13 were sequentially formed on a substrate 10 by means of a MOCVD deposition method in which $NH_3$ is used as a V-group nitrogen precursor, metal organic substances are used as a III-group metal (Ga, In, Al) precursor and $H_2$ is used as a carrier gas. Then, $H_2$ of the carrier gas was replaced with $N_2$ to grow an $Al_xGa_yIn_{1-x-y}N$ active layer (multi layers or single layer) 14.

A p-$Al_xGa_yIn_{1-x-y}N$ layer 15 was grown on the $Al_xGa_yIn_{1-x-y}N$ active layer 14 using a mixture of ammonia and a hydrazine based source as nitrogen precursor and $N_2$ as a carrier gas.

It is preferred that the amount of hydrazine based source used to grow the p-type AlGaInN:Mg thin film is in a range of 1 to 500 in the molar flow ratio of hydrazine based source and gallium (V(hydrazine based source)/III(gallium)), more preferably is in a range of 1 to 300.

At this time, preferably the amount of ammonia mixed is in a range of 100 to 10000 in the molar flow ratio of V(ammonia)/III(Ga), more preferably is in a range of 100 to 8000.

EXAMPLE 2

When a p-$Al_xGa_yIn_{1-x-y}N$ layer is grown using a mixture of hydrazine based source and ammonia as in Example 1, nitrogen, hydrogen or a mixture of nitrogen and hydrogen can be used as carrier gas.

EXAMPLE 3

When a p-$Al_xGa_yIn_{1-x-y}N$ layer is grown using a mixture of hydrazine based source and ammonia as in Example 1, a growth temperature can be in a range of 500° C. to 1150° C. It is preferable that the growth temperature is in a range of 700° C. to 1100° C.

If the temperature is below 700° C., a characteristic and surface state of the grown p-GaN thin film are degraded because the temperature is low. If the temperature is over 1000° C., the active layer that is grown at a relatively lower temperature is susceptible to damage.

EXAMPLE 4

When a p-GaN is grown using a mixture of hydrazine based source and ammonia as in Example 1, it is preferred that the growth pressure may be in a range of 1 torr to 800 torr and more preferably, the growth pressure is in a range of 20 torr to 760 torr.

In case of a MOCVD reactor, in a pressure of below 20 torr and over 760 torr, there is a tendency that reproducibility and stability property are degraded. Also, since pre-reaction of hydrazine based source increases as the pressure increases, the use of a pressure of 760 or below 760 torr is preferred. If the pre-reaction increases, the growth speed of a thin film is reduced. Also, it is difficult to obtain a p-type layer when a thin film is grown.

EXAMPLE 5

After p-GaN has been grown according to the method proposed by the present invention, although the reactor is cooled under ammonia and hydrogen atmosphere, a p-type layer can be obtained.

EXAMPLE 6

After p-GaN has been grown according to the method proposed by the present invention, although the reactor is cooled under ammonia and nitrogen atmosphere, a p-type layer can be obtained.

EXAMPLE 7

After p-GaN has been grown according to the method proposed by the present invention, although a reactor is cooled under ammonia, nitrogen and hydrogen atmosphere, a p-type layer can be obtained.

EXAMPLE 8

When a p-$Al_xGa_yIn_{1-x-y}N$ layer is formed according to the method proposed by the present invention, it can be formed in a thickness of 10 Å to 10000 Å as a single layer.

Considering a sufficient supply of holes, it is preferred that the p-$Al_xGa_yIn_{1-x-y}N$ layer is formed to a thickness of 10 or over 10 Å. If the p-$Al_xGa_yIn_{1-x-y}N$ layer is formed to a thickness of over 10000 Å, the time period during which the active layer is undergoing at a high temperature is lengthened as a device growth time becomes long. Thus, there is a high possibility that the active layer may be damaged.

EXAMPLE 9

When a p-$Al_xGa_yIn_{1-x-y}N$ layer is formed according to the method proposed by the present invention, two ore more p-Al$_x$Ga$_y$In$_{1-x-y}$N layers whose (x,y) values are different are stacked. At this time, a thickness of each of the two or more p-Al$_x$Ga$_y$In$_{1-x-y}$N layers can be in a range of 10 Å to 10000 Å. It is preferred that the sum of the thicknesses of the multilayers is in a range of 10 Å to 10000. Considering a sufficient supply of holes, it is preferred that the p-Al$_x$Ga$_y$In$_{1-x-y}$N layer is formed to a thickness of 10 or over 10 Å. If the p-Al$_x$Ga$_y$In$_{1-x-y}$N layer is formed to a thickness of over 10000 Å, the time period during which the active layer is undergoing at a high temperature is lengthened as a device growth time becomes long. Thus, there is a high possibility that the active layer may be damaged.

The invention claimed is:

1. A method for manufacturing a GaN based optical device, the method comprising the steps of:
   growing a p-type nitride semiconductor layer using NH$_3$ and a hydrazine based source as a nitrogen precursor; and
   doping the p-type nitride semiconductor layer with magnesium (Mg),
   wherein the p-type nitride semiconductor layer includes gallium and the molar flow ratio of hydrazine based source and gallium (Ga)(V(hydrazine based source) /III (gallium)) is in a range of 1 to 300;
   the p-type nitride semiconductor layer includes gallium and the molar flow ratio of NH$_3$ and gallium (Ga) (V(ammonia) /III(gallium)) is in a range of 100 to 8000;
   the p-type nitride semiconductor layer is grown at a temperature of 700° C. to 1100° C. and at a pressure of 20 torr to 760 torr;
   the p-type nitride semiconductor layer has a thickness of 10 Å to 10000 Å; and
   the p-type nitride semiconductor layer exists on an active layer that generates light by recombining holes and electrons.

2. The method for manufacturing a GaN based optical device of claim 1, wherein when the hydrazine based source is thermally decomposed, the hydrazine based source generates a radical capable of combining with a hydrogen radical.

3. The method for manufacturing a GaN based optical device of claim 2, wherein the p-type nitride semiconductor layer is grown by eliminating hydrogen radicals separated from NH$_3$ through combination with the radical generated from the hydrazine based source.

4. The method for manufacturing a GaN based optical device of claim 2, wherein the radical includes least one of CH$_3$ and NH$_2$.

5. The method for manufacturing a GaN based optical device of claim 1, wherein the hydrazine based source is selected from at least one of a group consisting of monomethylhydrazine, dimethylhydrazine and tertiarybutylhydrazine.

6. The method for manufacturing a GaN based optical device of claim 1, wherein the nitrogen precursor is carried by a carrier gas and the carrier gas includes at least one of nitrogen and hydrogen.

* * * * *